(12) United States Patent
Hynes

(10) Patent No.: US 7,466,181 B2
(45) Date of Patent: Dec. 16, 2008

(54) DOSE RATE EVENT PROTECTION CLAMPING CIRCUIT

(75) Inventor: Owen J. Hynes, Otsego, MN (US)

(73) Assignee: Honeywell International Inc., Morristown, NJ (US)

( * ) Notice: Subject to any disclaimer, the term of this patent is extended or adjusted under 35 U.S.C. 154(b) by 347 days.

(21) Appl. No.: 11/185,262

(22) Filed: Jul. 20, 2005

(65) Prior Publication Data
US 2007/0023840 A1    Feb. 1, 2007

(51) Int. Cl.
*H03K 3/00*    (2006.01)
*H03L 5/00*    (2006.01)

(52) U.S. Cl. ..................... 327/321; 327/309

(58) Field of Classification Search ............ 327/309, 327/321, 314, 312; 365/158
See application file for complete search history.

(56) References Cited

U.S. PATENT DOCUMENTS 5,705,940 A * 1/1998 Newman et al. ............ 326/68
7,286,393 B2 * 10/2007 Hynes et al. ................ 365/158

* cited by examiner

*Primary Examiner*—Dinh T. Le
(74) *Attorney, Agent, or Firm*—McDonnell Boehnen Hulbert & Berghoff LLP

(57) ABSTRACT

A novel system for protecting one or more circuits during a dose rate event is presented. A clamping circuit is utilized that outputs a voltage signal that may be used to control prevent circuits from receiving input signals during a dose rate event. The clamping circuit comprises a photocurrent generating device that creates a current as a function of dose rate event strength. This current is used to control a grounding switch, which pulls the clamping circuit output to ground when a substantial current is created by the photocurrent generating device. The clamping circuit output may control a coupling switch that permits external input signal current flow when the clamping circuit output is above a threshold voltage level, and may prevent current flow when the output is grounded. The photocurrent generating device may be a PMOS device, while the coupling switch and clamping switch may be realized by NMOS devices.

19 Claims, 4 Drawing Sheets

DOSE RATE EVENT PROTECTION CLAMPING CIRCUIT

STATEMENT REGARDING FEDERALLY SPONSORED RESEARCH

This invention was at least partially made with U.S. Government support under contract DTRA01-00-C-0002 awarded by the Defense Threat Reduction Agency. Accordingly, the government may possess certain rights in the invention.

BACKGROUND OF THE INVENTION

1. Field of the Invention

The present invention relates to the field of circuits designed to mitigate the effects of exposure to high radiation levels. More specifically, the present invention relates to circuits designed to protect electrical systems during a dose rate event.

2. Description of the Related Art

The function of electrical circuits may be adversely affected by the effects of cosmic and nuclear radiation, which may manifest in the form of gamma rays, x-rays, and high energy particles such as neutrons, photons, electrons, ionized single particles, and beta particles. The rate at which these energetic particles are absorbed by an integrated circuit in a given environment is considered to be the dose rate, and is usually measured in rads in silicon per second (rad(Si)/sec). The dose rate of most environments is generally quite low and has little or no effect on the function of integrated circuits. However, aerospace environments are generally characterized with periods of elevated dose rates that may be several orders of magnitude larger than those experienced on the ground. Additionally, a nuclear weapon detonation creates an environment characterized by an extremely high dose rate delivered within a relatively narrow pulse width (on the order of nanoseconds). Integrated circuits designed to operate in both of these environments and other high dose rate environments must be able to withstand the adverse effects that accompany elevated absorbed dose rates.

Unlike single event effects, dose rate effects are not confined to a primary disruption of a single device in an integrated circuit. Additionally, unlike total ionizing dose effects, dose rate effects are generally transient events and are not the result of prolonged exposure to ionizing radiation environments. The intense bombardment of energetic and ionized particles during a dose rate event may generate electron-hole pairs within silicon and silicon-dioxide regions of integrated circuits. Excess charge created by this bombardment near semiconductor device junctions may be swept across the junction by electric field-induced drift and by carrier diffusion, resulting in a reverse leakage current in the junction. This leakage current, or photocurrent, may persist between a few nanoseconds to a few microseconds and comprise drift-induced current (prompt photocurrent) and diffusion current (delayed photocurrent). The total photocurrent produced at a junction is dependent on both the dose rate and junction characteristics, such as doping density. Generally, junctions with larger current ratings produce more photocurrent during a dose rate event.

Photocurrent generated in integrated circuit devices during a dose rate event may have several adverse effects on the functionality and integrity of the system. In the most extreme cases, the photocurrent itself may be sufficient to permanently or catastrophically damage integrated circuit components via a process termed burnout. During a burnout, the transient photocurrent may be sufficient to raise the temperature of metal layers in the integrated circuit to their melting point, thereby permanently damaging the circuit. Additionally, intense photocurrent may trigger a latchup in certain devices, which may result in a condition where an active device is fixed into a constant "on" position. In digital integrated circuits, the photocurrent can cause voltage glitches at nodes and may cause bit flips in memory elements, data latches, and shift registers. In linear circuits, photocurrents may cause output voltage transients that may last several milliseconds and adversely affect electrically coupled systems.

Previously, the problem of photocurrents in integrated circuits has been addressed by such circuit design techniques as current limiting. This method requires the use of additional active or passive components in order to prevent the creation of currents that are sufficiently large to cause burnout. In general, resistive elements are integrated into the system near device terminals in order to achieve this effect. However, adding resistive elements to the conductive paths flowing into device terminals may effectively increase the load experienced by each device, which may in turn decrease the overall speed of the system. Furthermore, during a dose rate event photocurrent flowing through current limiting devices may lower the voltage provided to system components, thereby lowering their upset threshold levels.

Other methods currently employed to counter the effects of photocurrents include using lower supply voltages, or increasing the time constant of circuits through the use of passive delay components. However, as a consequence both of these methods reduce the maximum speed of the system. Additionally, the use of lower supply voltages reduces the noise margins of devices in digital circuits making the system more susceptible to input signal voltage fluctuations.

The above methods for addressing the adverse affects of dose rates and photocurrents are generally limited in scope to decreasing the amplitude of photocurrents as experienced by individual system components. However, in sensitive digital systems or in linear circuits the presence of even slight voltage variations resulting from photocurrents may be sufficient to cause adverse behavior resulting in the processing or storage of corrupt data. As a result, simply reducing the strength of photocurrents generated by system components is not sufficient to adequately protect sensitive circuits during dose rate events. During a dose rate event, consideration must also be given to preventing current and voltage variations from being incorporated by digital processing and memory components, and manifesting as erroneously calculated or stored data.

In light of the above considerations, it would be desirable to have a dose rate protection circuit that can prevent a sensitive system from incorporating data corrupted by the effects of a dose rate event. Specifically, it would be desirable for this circuit to control a sensitive system such that the system selectively processes input signals depending on whether it is currently experiencing the effects of a dose rate event. Additionally, it would be beneficial for the circuit to be capable of providing a protective response commensurate with the strength of the dose rate event.

SUMMARY OF THE INVENTION

In general the present invention relates to a system designed to protect electrical components during a period of elevated radiation levels, such as those that may occur during a dose event. In one aspect, the invention relates to a dose rate protection circuit for isolating a sensitive electrical component or components during a dose rate event comprising: a first device that generates a photocurrent during a dose rate event; a second device that selectively bridges a switch node to a low voltage potential when a sufficient photocurrent is generated by the first device; and a buffer that generally maintains the switch node at a high voltage potential when the second device is not active. In another aspect, this system further comprises a current switch controlled by the voltage of the switch node, wherein the current switch selectively allows current to flow into a sensitive electrical component or components.

In another aspect, the invention relates to a circuit for protecting an electrical system during a dose rate event comprising: a first p-channel metal oxide semiconductor (PMOS) transistor having its drain coupled to a control node, and its gate and source coupled to a high voltage potential; a first n-channel metal oxide semiconductor (NMOS) transistor having its drain coupled to a switch node, its gate coupled to the control node, and its source coupled to a low voltage potential; and a resistive element between the control node and the low voltage potential. In another aspect the circuit further comprises a capacitive element between the control node and the low voltage potential. In another aspect, the circuit further comprises a current switch controlled by the switch node, in which this current switch may be realized by a second NMOS transistor. In yet another aspect, this circuit further comprises a buffer circuit whose output is coupled to the switch node.

BRIEF DESCRIPTION OF THE DRAWINGS

Embodiments of the invention are described below in conjunction with the appended figures, wherein like reference numerals refer to like elements in the various figures, and wherein.

DETAILED DESCRIPTION

The invention provides a framework for selectively controlling the operation of a protected circuit as a function of the amplitude of a dose rate event. Additionally, the invention provides a framework for selectively permitting input signals to reach a protected circuit during a dose rate event. The ability to control and shield the protected circuit is accomplished by utilizing the properties of and responses of semiconductor devices, especially metal oxide semiconductor (MOS) transistors, during dose rate events. More specifically, the photocurrent created in MOS transistors during high radiation dose rate events is exploited to change the voltage of control and switch nodes in a circuit. The voltages of these nodes are used to control other switch devices that may selectively isolate external protected integrated circuit components by, for example, preventing input signals from reaching these components during and for a period of time after a dose rate event. In one sense, the ability to isolate a sensitive circuit during a dose rate event may be employed to ensure that the sensitive circuit does not receive or store data from input signals that may have been adversely affected by the high radiation levels of the dose rate event.

Figure 1:
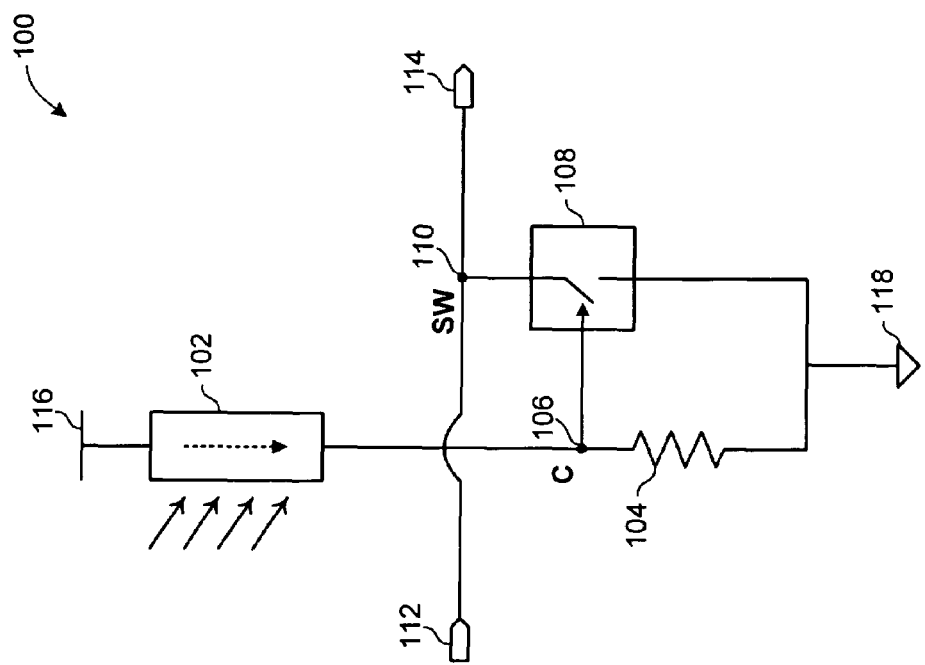
FIG. 1 is a schematic of a dose rate protection clamping system comprising a device that generates photocurrent during a dose rate event and a ground switch, according to an embodiment.

FIG. 1 shows a schematic of a dose rate protection circuit 100 comprising a device that generates photocurrent during dose rate events and a switch that selectively pulls an output signal voltage low. The circuit utilizes two reference voltages of VCC 116 and VSS 118, and processes a control input signal 112 to provide an output a switch signal 114, which may be used to isolate a protected circuit during a burst of radiation, such as generally characterizes a dose rate event. The two separate voltage sources of VCC 116 and VSS 118 may be generated externally, where VCC 116 is the high voltage source and has a voltage potential greater than the low voltage source VSS 118. Generally VSS 1 18 may be considered the reference voltage, or electrical ground of the circuit, with VCC 116 being the power voltage source that is maintained at a substantially constant potential above the reference voltage VSS 118. In one embodiment, VSS 118 may be at a voltage potential of 0 V and VCC 116 may be at a relative voltage potential of 3.3 V. The control input signal 112 may be generated by external control logic and may be set according to the desired output signal 114. The control input signal 112 and the switch signal 114 are coupled by a switch node 110. The control input signal 112 is ordinarily directly passed through to the switch signal 114; however, as further described below, the switch node 110 may be selectively pulled to a low voltage potential during a dose rate event, thereby pulling the output switch signal 114 to a low voltage potential as well.

The circuit comprises a photocurrent generating device 102 that produces a current during a dose rate event. The strength of the current may be a function of the properties of the photocurrent generating device 102 and the intensity of the radiation bombardment defining the dose rate event. This current is directed towards a control node 106 and passes through a resistive element 104 before reaching VSS 118. As the current from the photocurrent generating device 102 passes through the resistive element 104 it creates an elevated voltage potential at the control node 106. The elevated voltage potential created at the control node 106 may be determined as being proportional to the strength of the current and the electrical resistance of the resistive element 104. Specifically, the voltage potential created at the control node 106 may be substantially equal to the product of the current created by the photocurrent device 102 and the resistance of the resistive element 104.

The control node acts to control a ground switch 108, which behaves in the following manner: if the control node 106 is raised to a sufficient voltage potential, then the ground switch 108 is activated and acts to couple the switch node 110 to VSS 118; however, if the control node 106 is maintained substantially below the sufficient voltage potential or at no relative voltage potential then the ground switch 108 is inactive, or open, and does not couple the switch node 110 to VSS 118. The value of the sufficient voltage potential is a characteristic of the ground switch 108 and is the voltage required to activate, or close, the ground switch 108. Generally the value of the sufficient voltage potential may be between the voltage potentials of VSS and VCC. In one embodiment, the ground switch 108 may be capable of states that partially couple the switch node 110 to the low voltage potential source 118. In this embodiment, if the control node 106 is maintained at the threshold voltage of the ground switch 108, then the ground switch will minimally couple the switch node 110 with the low voltage potential source VSS 118; as the voltage potential of the control node 106 increases beyond the threshold voltage of the ground switch 106, the strength of this coupling may also increase.

The effect of the ground switch 108 during a dose rate event is to essentially ground the switch node 110 to the reference voltage of the system, or VSS 118. Therefore, the switch node 110 (and therefore the switch signal 114) is generally maintained at the voltage potential defined by the input signal 112 except in the case of a dose rate event, in which case the photocurrent generated by the photocurrent generating device may be large enough to activate the ground switch 108 and pull the switch node 110 low. Consideration must be given to the parameters of the ground switch 108, especially its current limit, as the switch must be capable of overcoming the strength of the input signal 112 in order to pull the switch node 110 to a low potential, as further described below.

Figure 2:
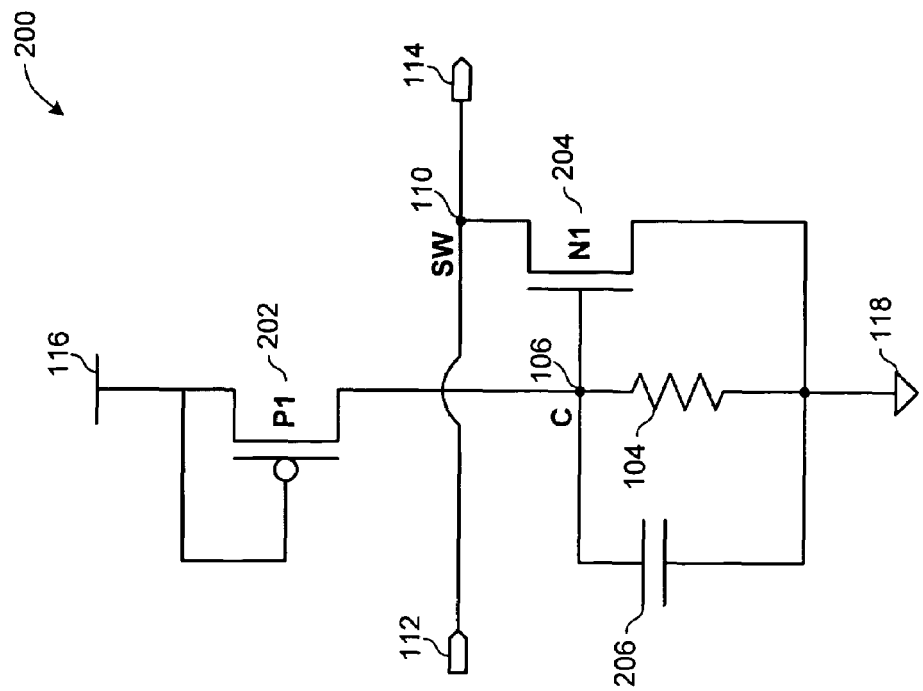
FIG. 2 is a schematic of a dose rate protection clamping circuit comprising MOS transistor devices, according to an embodiment.

FIG. 2 shows a schematic of a dose rate protection circuit 200 in which MOS transistors are used to realize a photocurrent generating device and a ground switch. A p-channel MOS (PMOS) transistor P1 202 is utilized as a photocurrent generating device and is configured with its source and gate coupled to VCC 116, and its drain coupled to the control node 106. Additionally, the base of P1 202 may be tied to the source and VCC 116. During a dose rate event, P1 202 will generate a photocurrent that may be proportional to its doping characteristics, active area, and the strength of the dose rate event. More specifically, increases in the PMOS transistor P1 202 doping level and active area lead to stronger photocurrents. Likewise, the more intense the dose rate event, the greater the strength of the generated photocurrent. As the transistor P1 202 is generally isolated from any external circuits, its active area may be designed without a general concern for any excessive loading effects that may reduce the speed of the system; thus P1 202 may be chosen to be substantially larger than other PMOS transistors in the system in order to generate a larger photocurrent during a dose rate event, without adversely affecting the timing constraints of systems coupled to the dose rate protection circuit 200.

This photocurrent will flow towards the control node 106 and will pass through the resistive element 104 before reaching VSS 118. When the generated photocurrent passes through the resistive element 104 it generates an elevated voltage potential at the control node 106, wherein this elevated voltage potential is substantially proportional to the strength of the photocurrent and the resistance of the resistive element 104.

An n-channel MOS (NMOS) transistor 204 is utilized in the circuit as a ground switch that selectively couples the switch node 106 to VSS 118. The gate of N1 204 is coupled to the control node 106, with the drain being coupled to the switch node 110, and the source being coupled to VSS 118. Additionally, the base of N1 204 may be tied to the source and VSS 118. When the control node 106 is at an elevated voltage potential above the gate threshold voltage of N1 204, the transistor N1 204 is activated and acts as a transmission path between the switch node 110 and VSS 118. Thus, when N1 204 is activated the switch node 110 is pulled to a low voltage potential as defined by the value of the reference voltage VSS 118. As is characteristic of NMOS devices, the higher the elevated voltage potential is above the gate threshold voltage of N1, the stronger the coupling between the switch node 110 and the low voltage potential source, VSS 118. In accordance with this characteristic, a stronger coupling between the switch node 110 and VSS 118, results in an increased ability of N1 204 to pull the switch node 110 to a low voltage potential.

In many instances it may be advantageous for the ground switch to be activated for a period of time after the dose rate event has subsided. The presence of the resistive element 104 may help to increase the time constant associated with the control node 106 and keep the node at an elevated potential voltage for a period of time after the dose rate event has occurred. Additionally, a capacitive element 206 may be added in parallel to the resistive element 104 so as to further increase the time constant associated with the control node 106. The capacitance of the capacitive element 206 may be selected to provide a time constant and delay that allows for the ground switch to remain active for several nanoseconds or milliseconds after the production of current by the photocurrent generating device has ceased.

Figure 3:
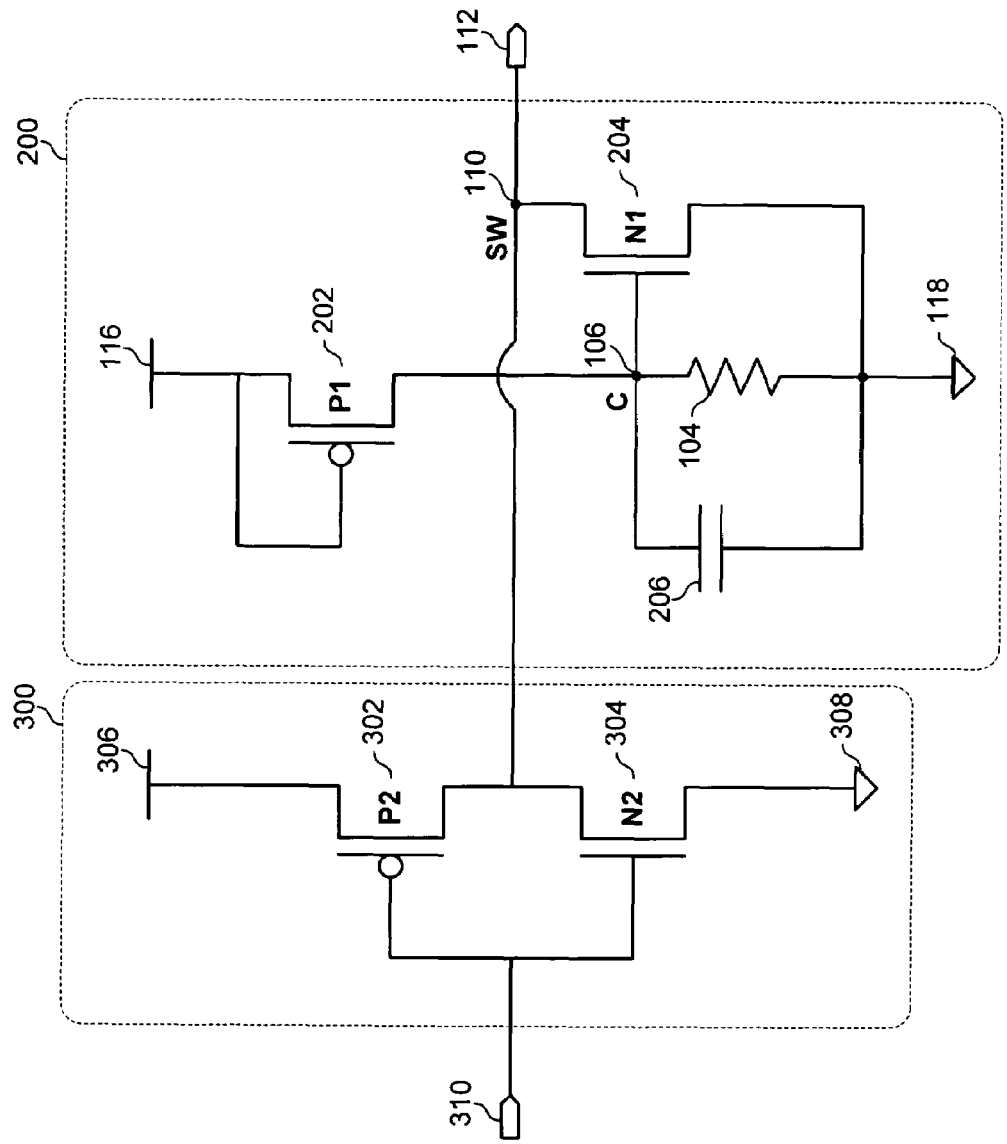
FIG. 3 is a schematic of a dose rate protection clamping circuit comprising an input buffer circuit, according to an embodiment.

FIG. 3 shows a schematic of a dose rate protection circuit with an input buffer comprising a complementary MOS (CMOS) inverter. The inverter receives a primary input reference signal 310 and generates an inverted output signal that is coupled to the switch node 110. The CMOS inverter 300 comprises a PMOS transistor P2 302 and an NMOS transistor N2 304. P2 302 has its gate coupled to the primary input reference signal 310, its drain coupled to VCC 306, and its source coupled to the output of the inverter and therefore the switch node 106. N2 304 has its gate coupled to the primary input reference signal 310, its drain coupled to VSS 308, and its source coupled to the output of the inverter and therefore the switch node 110. As indicated above, during normal operation the switch node 106 may be held at a high voltage potential substantially equal to the voltage of VCC 308, which would require the primary input reference signal 310 to be at a potential voltage level such that P2 302 is activated and N2 304 is cut-off. As a result, the primary input reference signal 310 may be normally coupled to VSS. This may be accomplished by grounding the input 310 to VSS; alternatively external input control logic may be used that may selectively set the input reference signal 310 to VCC or VSS.

Generally, when the transistor Ni 204 is activated during a dose rate event, its pull-down strength should be sufficient to overcome the pull-up strength of P2 302. If the input buffer of the dose rate protection circuit is not an inverter, then the pull-down strength of the ground switch transistor N1 204 must be strong enough to overcome the pull-up strength of the equivalent buffer circuit. Increasing the pull-down strength of N1 204 may be accomplished by increasing its current capacity by, for example, increasing its active area.

Although the activation of the ground switch transistor Ni 204 during a dose rate event is primarily responsible for pulling the switch node 110 to a low voltage potential state, the photocurrents generated by transistors in both the dose rate protection clamping circuit 200 and the buffer inverter 300 may also aid in this process. During a dose rate event, the inverter NMOS transistor N2 304 will generate a junction photocurrent that is directed towards the VSS source 118 coupled to its source node. Likewise, during a dose rate event the transistor N1 204 will also generate a photocurrent that may help to pull the switch node to a logical low voltage level, such as may be defined by VSS 118.

Figure 4:
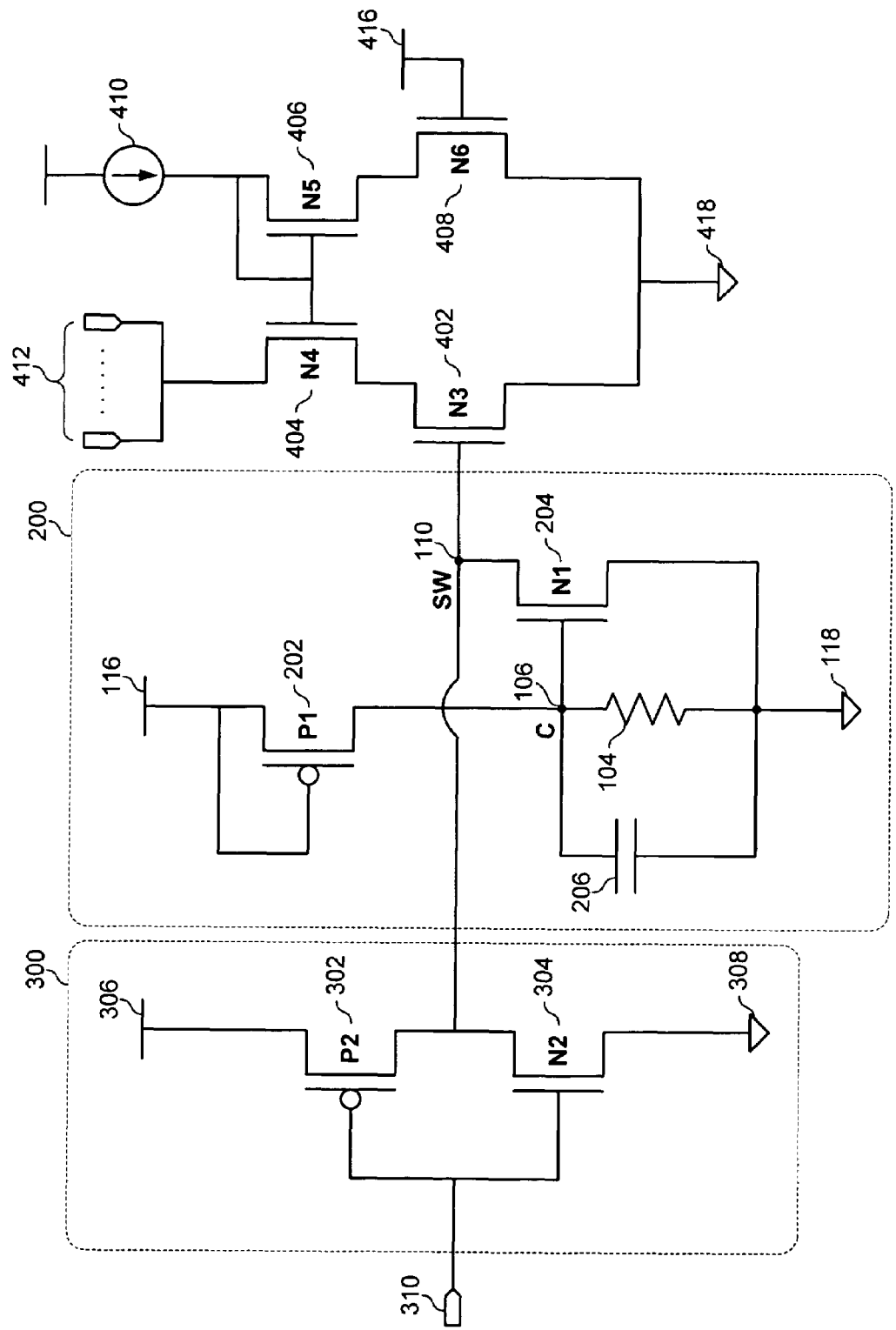
FIG. 4 is a schematic of a dose rate protection clamping circuit comprising a buffer circuit and a current switch that selectively permits input signals to reach an isolated circuit.

FIG. 4 shows one manner in which a dose rate protection clamping circuit may isolate a protected circuit from one or more input signals during a dose rate event. In the embodiment shown, the input signals 412 of a protected circuit (not shown) are driven by a current mirror. The current mirror may be any current mirror that is known in the art, and specifically a ground-referenced current mirror. In one embodiment, the current mirror may comprise an independent current source 410, and a pair of matched n-channel transistors 404, 406. The current mirror acts as a driver by creating a current for the input signals 412 that is substantially equal to that of the independent current source 410. The current flow of the input signals 412 that is generated by the current mirror may be controlled by a coupling switch 402, as further described below. The unity of the current mirror gain may be preserved in the presence of the coupling switch 402 by including a matched switch 408 that is maintained at a constant active state. To preserve the necessary symmetry, the matched switch 408 should have substantially the same electrical characteristics as the coupling switch 402. In one embodiment, this coupling switch 402 may be realized by an NMOS transistor N3; in this embodiment the matched switch 408 may also be realized with a similarly sized NMOS transistor N6 whose gate is tied to a source having a voltage greater than the gate threshold voltage of N6, such as VCC.

The coupling switch controls the input signals 412 by either permitting or preventing their current flow. When the coupling switch 402 is closed, or activated, it permits current flow in the input signals 412 by coupling to the ground reference voltage source 418 of the circuit, thereby completing a conductive path for the current. When the coupling switch is not active the conductive path is broken and current in the input signals 412 is prevented from flowing. The coupling switch 402 may be activated when the switch node 106 is at a voltage above the threshold of the coupling switch 402, and may be deactivated when the switch node 106 is below this threshold voltage. In the case where the coupling switch is an NMOS transistor N3, the threshold voltage may be the gate threshold voltage of N3.

In one embodiment, the protected circuit may be a RAM system, specifically an MRAM system, and the input signals may be program lines used to transfer data to and from the memory system. In another embodiment, a switch node may be connected to multiple coupling switches, each of which controls separate groups of input signals; in this manner, a single dose rate protection clamping circuit 200 may be used to control the input signals to multiple protected circuits.

Figure 5:
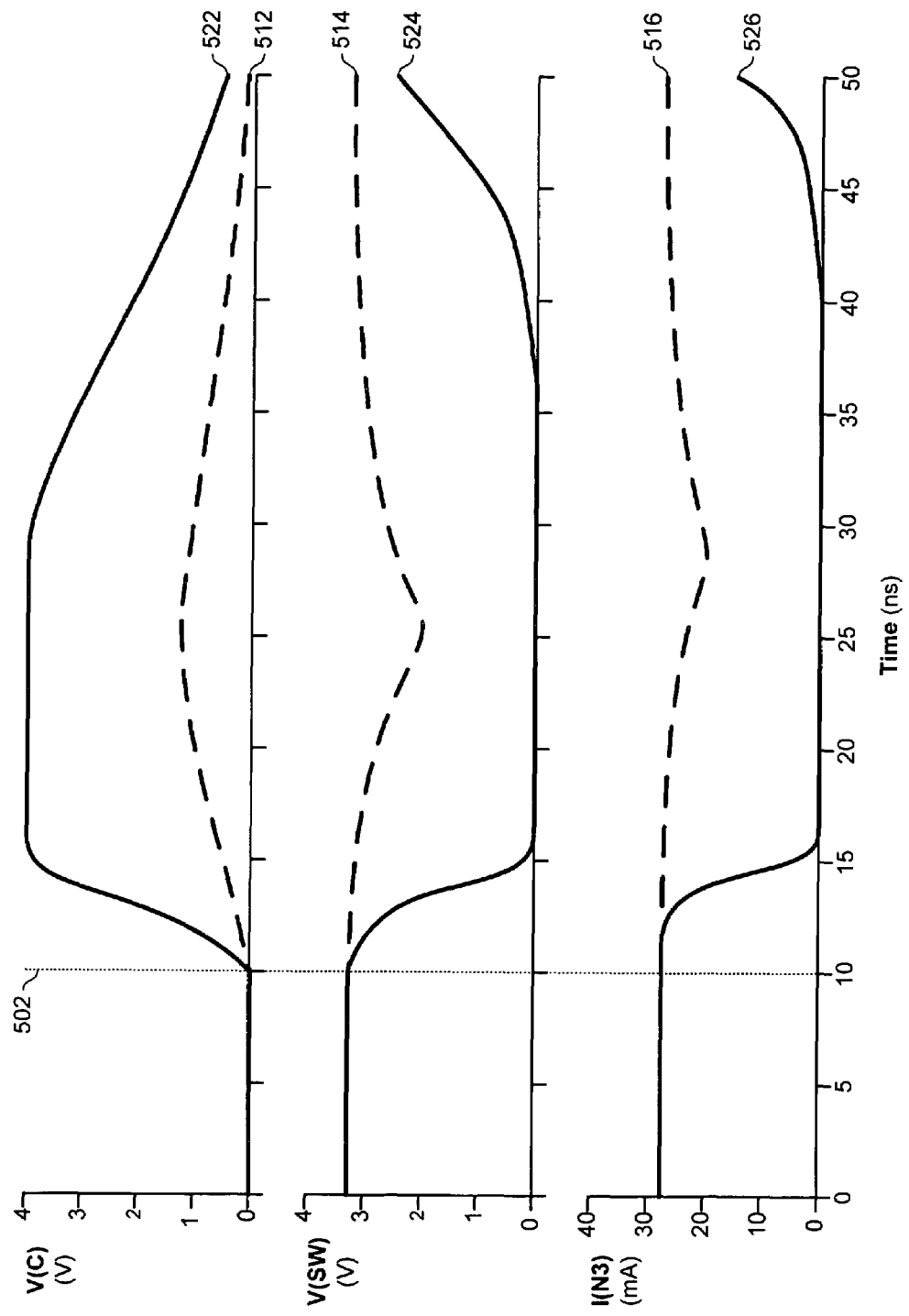
FIG. 5 is a set of illustrative simulation results showing the electrical response of several nodes and devices in a dose rate protection clamping circuit comprising a current switch, including the voltage response of the control node, the voltage response of the switch node, and the current response of the current switch, according to varying dose rate events.

FIG. 5 illustrates the response to varying dose rate events by a dose rate protection clamping circuit comprising a coupling switch, such as the circuit shown in FIG. 3. The voltage of the control node V(C), the voltage of the switch node V(SW), and the coupling switch current I(N3) are illustrated for a dose rate protection clamping circuit having the following general characteristics: a VCC voltage of 3.3 V, a VSS voltage of 0 V, a reference current source of 200 μA, a resistive element of 50 kΩ, and a capacitive element of 50 fF. The circuit also comprises an input buffer that nominally pulls the switch node voltage up to VCC. The dose rate of the system is simulated by an impulse signal beginning at 10 ns, having rise and fall times of 5 ns and a pulse width of 10 ns. For the first simulation, the dose rate event has an amplitude of $10^{10}$ rad(Si)/sec. In response to this dose rate strength, the control node voltage 512 response begins at the onset of the dose rate event 502, but does not rise substantially above 0.7 V for the duration of the dose rate event. The drop in the control node voltage 512 is reflected in the switch node voltage 514 response which shows a slight drop in amplitude as the control switch attempts to pull the switch node to VSS. In this case, the slight dip in the switch node voltage 514 is only sufficient to cause a slight drop in the coupling switch current 516.

For a dose rate event having an amplitude of $10^{11}$, however, the simulated response of the dose rate protection clamping circuit is much more acute. At the onset of the dose rate event 502, the current generated by the photocurrent generating device passing through the resistive element creates an immediate increase in the control node voltage 522. The potential is maintained at its maximum of about 4 V for the duration of the dose rate event and slowly begins to decrease at around 35 ns, when the dose rate event has terminated. The rate at which the control node voltage 522 decreases is at least partially controlled by the resistance of the resistive element and the capacitance of the capacitive element, with increases in both the resistance and capacitance leading to a slower rate. As the control node voltage 522 increases, it activates the control switch which pulls the switch node voltage 524 to VSS, or 0 V. The switch node voltage 524 remains at VSS for the duration of the dose rate event and slowly begins to return to its nominal state at VCC, or 3.3 V, as the control node voltage 522 decreases. Once the switch node voltage 524 falls, the coupling switch restricts the coupling switch current 526, and the current flow of the input signals, until a period of time after the dose rate event has terminated.

As shown above, the dose rate protection clamping circuit may offer varying degrees of diminishing the current in the input signals as a function of the dose rate event amplitude. The sensitivity of the dose rate protection clamping circuit to the strength of the dose rate event may be increased by modifying the photocurrent generating device to create a larger photocurrent during a dose rate event. Other modifications, such as increasing the resistance of the resistive element, or increasing the pull-down strength of the grounding switch with respect to the pull-up strength of the input buffer circuit, may also be used to create a dose rate protection clamping circuit with a greater sensitivity to the amplitude of dose rate events.

Exemplary embodiments of the present invention relating to a system and circuit for protecting a device during a dose rate event are presented. It should be noted that the figures are not necessarily drawn to scale and are illustrative approximations of their respective embodiments. Similarly, it should also be noted that more significant changes in configuration are also possible and intended to be within the scope of the system taught herein. For example, alternative input buffer circuits may be used, and the dose rate protection clamping circuit may be applied to control circuits other than modified current mirrors.

Finally, in view of the wide variety of embodiments to which the principles of the present invention can be applied, it should be understood that the illustrated embodiments are exemplary only, and should not be taken as limiting the scope and spirit of the present invention. The claims should not be read as limited to the described order or elements unless stated to that effect. It will be understood that variations in form and detail may be made to the invention without deviating from the spirit and scope of the invention, as defined by the following claims.

I claim:

1. A dose rate protection clamping circuit comprising:
    a first device that generates current towards a control node during a dose rate event;
    a resistive element coupled to the control node that generates a voltage potential at the control node when current is passed into the control node;
    a second device connected to the control node that couples a switch node with a reference voltage source when the resistive element generates the voltage potential at the control node; and
    an input and an output coupled by the switch node.

2. The circuit of claim 1 further comprising a current switch that prevents signal at the input from reaching a protected circuit at the output when the switch node is coupled to the reference voltage source.

3. The circuit of claim 2 wherein the current switch comprises at least one n-channel transistor.

4. The circuit of claim 1 wherein the first device comprises a p-channel transistor.

5. The circuit of claim 1 wherein the second device comprises an n-channel transistor.

6. The circuit of claim 5 further comprising a buffer having an output coupled to the switch node, wherein the buffer comprises a complementary MOS inverter.

7. The circuit of claim 6 wherein the buffer is characterized by a pull-up strength, and wherein the n-channel transistor of the second device has a pull-down strength greater than the pull-up strength of the buffer.

8. The circuit of claim 6 wherein the buffer comprises an inverter.

9. The circuit of claim 1 further comprising a capacitive element having a first end coupled to the control node and a second end coupled to the reference voltage source.

10. A dose rate protection circuit comprising:
a first NMOS device having a drain node, a source node, and a gate node, wherein the source node is coupled to a first reference voltage;
a first PMOS device having a drain node, a source node, and a gate node, wherein the gate node and source node are coupled to a second reference voltage, and the drain node is coupled to the gate node of the first NMOS device;
a resistive element having a first end coupled to the gate node of the first NMOS device and a second end coupled to the first reference voltage; and
an input and an output coupled by the drain node of the first NMOS device.

11. The circuit of claim 10 further comprising a capacitive element having a first end coupled to the gate node of the first NMOS device and a second end coupled to the first reference voltage.

12. The circuit of claim 10 further comprising a buffer circuit having an output coupled to the drain node of the first NMOS device.

13. The circuit of claim 12 wherein the buffer circuit comprises an inverter.

14. The circuit of claim 13 wherein the inverter comprises:
a second NMOS device having a drain node, a source node, and a gate node, wherein the gate node is coupled to an input signal, the source node is coupled to the first reference voltage, and the drain node is coupled to the output of the inverter; and
a second PMOS device having a drain node, a source node, and a gate node, wherein the gate node is coupled to an input signal, the source node is coupled to the second reference voltage, and the drain node is coupled to the output of the inverter.

15. The circuit of claim 14 wherein the first reference voltage is electrical ground and the second reference voltage is VCC.

16. The circuit of claim 15 wherein the current switch comprises a third NMOS device having a gate node, and wherein the drain node of the first NMOS device is coupled to the gate node of the third NMOS device.

17. A dose rate protection circuit comprising:
a first device that generates current towards a control node during a dose rate event;
a resistive element coupled to the control node that generates a voltage potential at the control node when current is passed into the control node;
a second device that couples a switch node with a reference voltage source when the resistive element generates the voltage potential at the control node;
a buffer that couples the switch node to a high voltage potential unless the switch node is coupled with the reference voltage source when the resistive element generates the voltage potential at the control node; and
a capacitive element having a first end coupled to the control node and a second end coupled to the low voltage potential, wherein an input is coupled to the buffer and an output is coupled to the switch node.

18. The circuit of claim 17 wherein the first device comprises a p-channel transistor and wherein the second device comprises an n-channel transistor.

19. The circuit of claim 17 further comprising a current switch that selectively permits input signals to reach a protected logic block when the switch node is coupled to the high voltage potential.

* * * * *